US006947122B2

(12) United States Patent
Kohda et al.

(10) Patent No.: US 6,947,122 B2
(45) Date of Patent: Sep. 20, 2005

(54) SCANNING EXPOSURE APPARATUS AND METHOD (75) Inventors: Tohru Kohda, Utsunomiya (JP); Shinji Tsutsui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 38 days.

(21) Appl. No.: 10/601,553

(22) Filed: Jun. 24, 2003

(65) Prior Publication Data

US 2004/0001191 A1 Jan. 1, 2004

(30) Foreign Application Priority Data

Jun. 28, 2002 (JP) .................................... 2002-191329

(51) Int. Cl.[7] .................. G03B 27/42; G03B 27/68; G03B 27/52; G03B 27/58; G03B 27/62
(52) U.S. Cl. ...................... 355/53; 355/52; 355/55; 355/72; 355/75
(58) Field of Search ........................... 355/53, 35, 55, 355/67, 43, 44, 72, 75, 77, 52; 250/398, 548, 492; 356/399, 400, 401

(56) References Cited

U.S. PATENT DOCUMENTS

| H001774 H | * | 1/1999 | Miyachi ...................... 355/67 |
| 6,522,386 B1 | * | 2/2003 | Nishi ........................... 355/52 |
| 6,727,980 B2 | * | 4/2004 | Ota et al. ..................... 355/55 |

FOREIGN PATENT DOCUMENTS

| DE | 198 05 875 | 4/1999 |
| JP | 8-264431 | 11/1996 |

OTHER PUBLICATIONS

Taiwanese Office Action dated Nov. 8, 2004, issued in corresponding Taiwanese patent application No. 92117473, with English translation.

* cited by examiner

*Primary Examiner*—Peter B. Kim
(74) *Attorney, Agent, or Firm*—Fitzpatrick, Cella, Harper & Scinto (57) ABSTRACT A scanning exposure apparatus includes an illumination optical system for illuminating a pattern on a mask using arc-shaped illumination light, a projection optical system for projecting the pattern on the mask illuminated by the illumination optical system onto a plate, a mask stage for scanning the mask, a plate stage for scanning the plate, the scanning exposure apparatus scanning the mask stage and plate stage synchronously relative to the projection optical system, a mask support mechanism for supporting a periphery of the mask, and a mask stage tilt mechanism for arranging the pattern in an area illuminated by the arc-shaped illumination light in an object-surface-side focal plane of the projection optical system, wherein the mask deforms due to its own weight from the peripheral supported.

12 Claims, 11 Drawing Sheets

SCANNING EXPOSURE APPARATUS AND METHOD

This application claims benefit of priority based on Japanese Patent Application No. 2002-191329, filed on Jun. 28, 2002, which is hereby incorporated by reference herein in its entirety as if fully set forth herein.

BACKGROUND OF THE INVENTION

The present invention relates to scanning exposure apparatuses and device fabrication methods using the same, and more particularly to an exposure apparatus suited to expose a large mask.

Recent displays, such as those of personal computers ("PCs") and televisions, have frequently used liquid crystal display ("LCD") substrates. The LCD substrate forms a desired shape of patterned transparent thin-film electrodes on a glass plate using photolithography, and the photolithography uses a projection exposure apparatus for exposing an original pattern formed on a mask onto a photoresist layer on the glass plate via a projection optical system.

The projection optical apparatus includes those types of so-called step-and-repeat and mirror projection manners.

Figure 13:
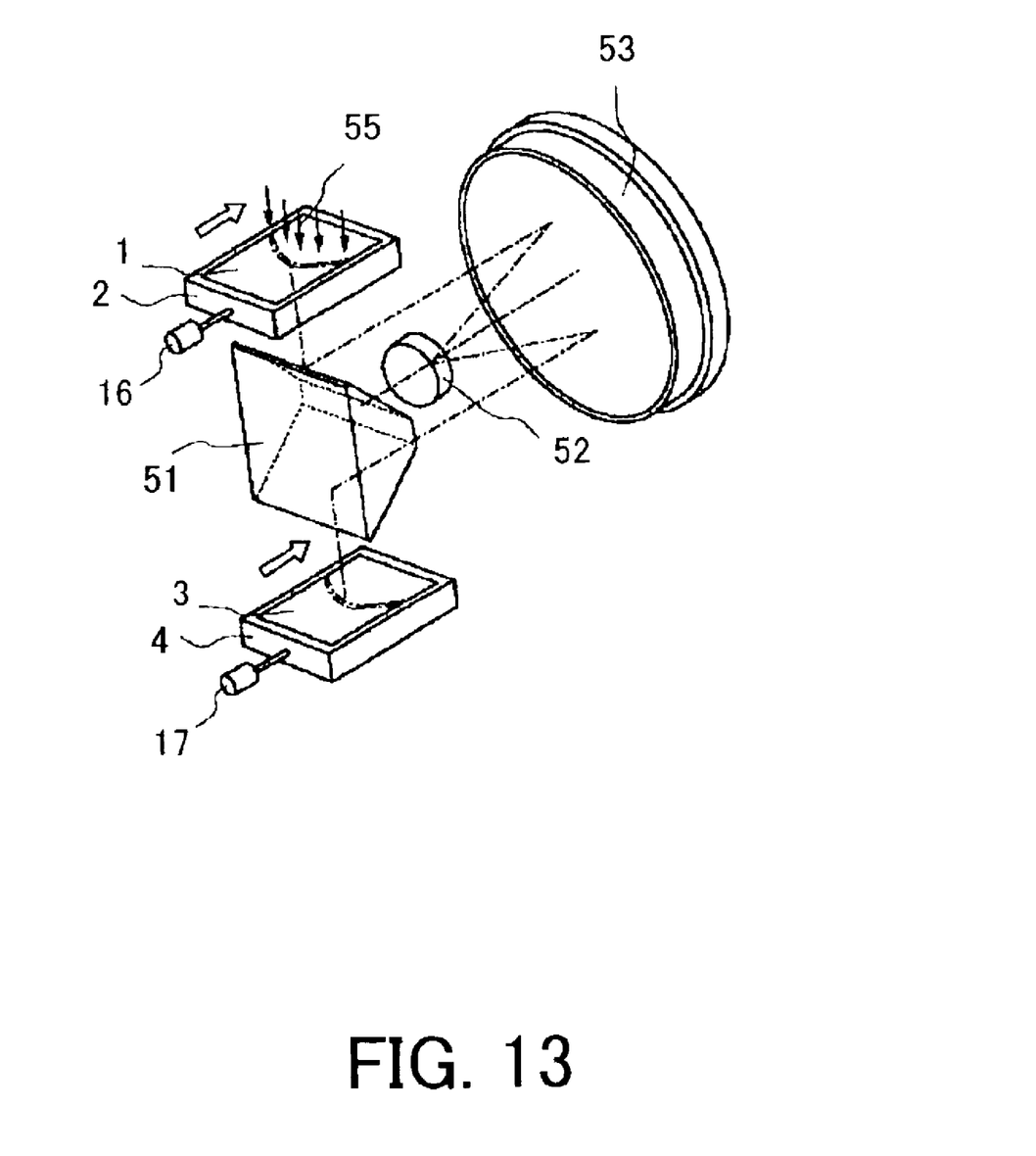
FIG. 13 is a schematic view of a principal part in a conventional scanning exposure apparatus.

The projection exposure apparatus has been requested to expand its exposure area with recent demands for a larger LCD substrate. FIG. 13 is a schematic view of a principal part in a conventional scanning exposure apparatus of a common mirror-projection type. In FIG. 13, 1 denotes a mask, 2 a mask stage for scanning the mask 1, 51–53 a projection optical system, 3 a plate such as a glass plate, and 4 a plate stage for scanning the plate 3. UV reactive photoresist is applied onto a surface of the plate 3. Reference numeral 11 represents arc-shaped illumination light from an illumination system (not shown).

As illustrated, the illumination system 7 generates the arc-shaped illumination light 55 using an arc-shaped aperture or a slit aperture arranged just before the mask 1 or at a position that is optically conjugate with the mask 1. Alternatively, use of an optical element such as a cylindrical lens would also provide similar arc-shaped illumination light.

An XYZ coordinate system is not shown. The illuminated scanning exposure apparatus aligns a longitudinal direction of the arc-shaped illumination light 13 with an X-axis direction, a transverse direction or a scan direction of the mask stage 2, and the-plate stage 6 with an Y-axis direction, and a direction perpendicular to an XY plane with a Z-axis direction.

A brief description will now be given of an operational principle. Only portion 10 of a pattern on the mask 1 is projected and transferred, which is subject to the arc-shaped illumination light. The entire circuit pattern on the mask 1 is projected and transferred onto the plate 5 by scanning the mask 1 at a specified speed in a direction of an arrow 9, as well as scanning the plate stage 6 in a direction of an arrow 8 at a speed of the former speed multiplied by an imaging magnification of the projection optical system 4.

A stage control system synchronizes the mask 1 and the plate 5, and control their scans. After the entire circuit pattern is transferred, the plate stage 6 moves or steps by a specified amount in the directions X and Y to repeat a pattern transfer of many different locations on the plate 5 in the same way as described above, and to expose an area larger than the drawn area on the mask.

A scan exposure with a large mask effectively enables an exposure apparatus for a broad exposure area to expose a large plate, such as a large-sized liquid crystal panel, with high throughput, and requires a pattern on the mask to focus on the plate across the entire broad exposure area.

A negative plate, such as a mask, would deform due to its own weight when supported horizontally. According to the strength of materials, the gravity deformation of the mask is proportionate to the fourth power of the length of one side of the mask, and remarkably increases as the mask becomes larger. For example, the following equation provides the maximum deformation $y_{max}$ of a level mask with both edges freely supported:

$$y_{max} = (5wL^4)/384EI \qquad (1)$$

where w is weight per unit length, L is a length of a supported interval, E is a Young's modulus, and I is a geometrical moment of inertia.

The maximum deformation of a level mask with both edges fixed is given by the following equation:

$$y_{max} = (wL^4)/384EI \qquad (2)$$

For example, a quartz mask with L=500 mm and a thickness of 10 mm has a maximum deformation $y_{max}$=30 μm with both edges supported, or $y_{max}$=6 μm with both edges fixed.

On the other hand, the mirror-projection type projection optical system has a depth of focus ("DOF") of approximately ±30 μm.

Therefore, the gravity deformation of the mask cannot be negligible relative to the DOF of the mask pattern projected image, and would deteriorate transfer performance such as resolution.

Figure 5:
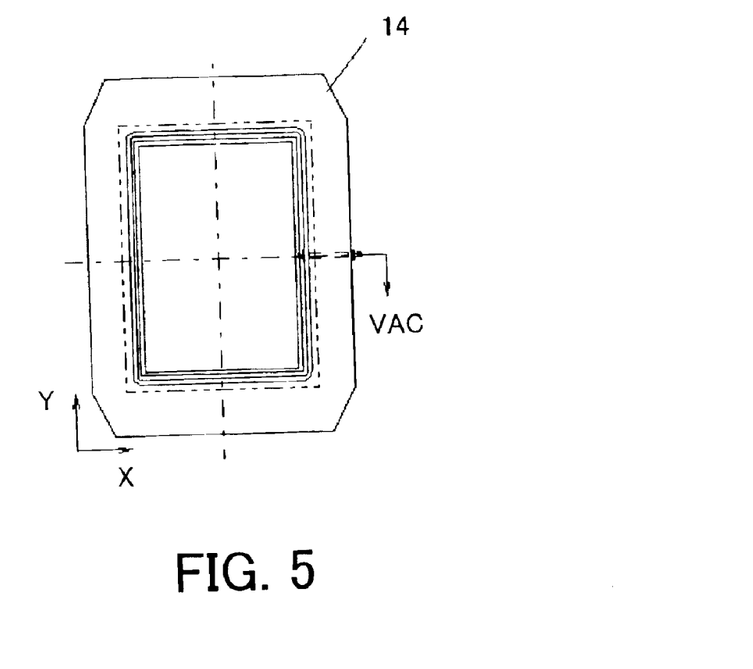
FIG. 5 is a schematic view of a mask support method that absorbs four sides.
Figure 6:
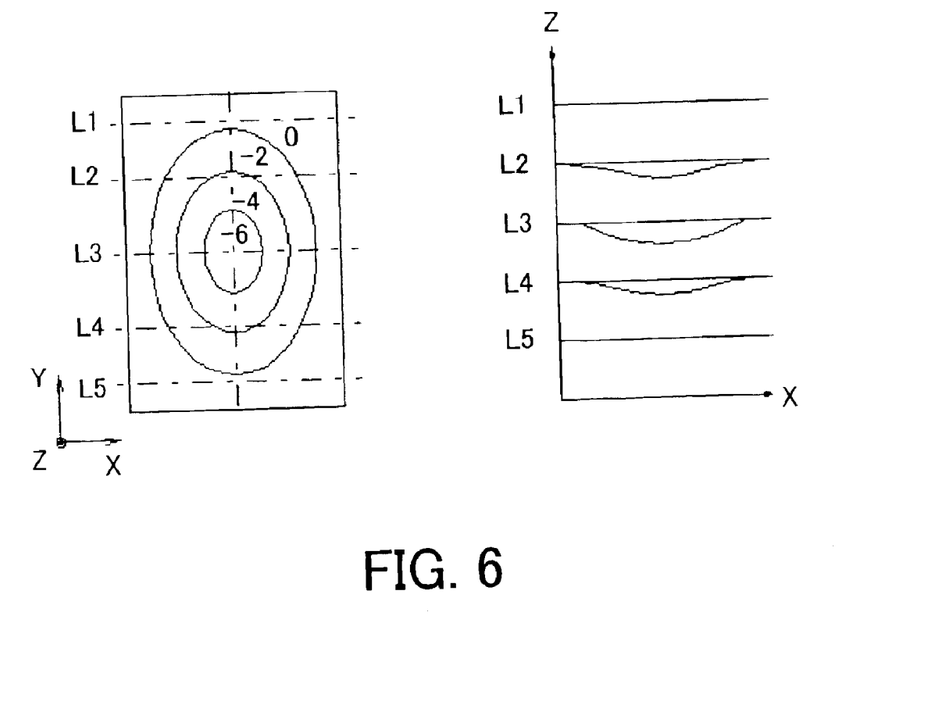
FIG. 6 is a view for explaining gravity deformation in a mask support method that absorbs four sides.

Even when a mask support means 14 supports four surrounding sides of the mask on the same flat surface, as in FIG. 5, a mask plane complicatedly deforms, as shown in FIG. 6, providing different sectional shapes.

BRIEF SUMMARY OF THE INVENTION

Accordingly, it is an exemplary object of the present invention to provide a scanning exposure apparatus, as well as a device fabrication method using the same, which facilitates projection exposure onto a large screen with high resolution, illuminating a mask that deforms due to its own weight, using arc-shaped illumination light to expose a pattern on the mask onto a plate through the projection optical system using a scanning exposure method, and a mask support method for arranging in place an arc-shaped illuminated mask pattern image surface and a plate surface imaged by the projection optical system.

A scanning exposure apparatus of one aspect of the present invention includes an illumination optical system for illuminating a pattern on a mask using arc-shaped illumination light, a projection optical system for projecting the pattern on the mask illuminated by the illumination optical system onto a plate, a mask stage for scanning the mask, a plate stage for scanning the plate, the scanning exposure apparatus scanning the mask stage and plate stage synchronously relative to the projection optical system, a mask support mechanism for supporting a periphery of the mask, and a mask stage tilt mechanism for arranging the pattern in an area illuminated by the arc-shaped illumination light in an object-surface-side focal plane of the projection optical system, wherein the mask deforms due to its own weight from the supported periphery.

A scanning exposure apparatus of another aspect of the present invention includes an illumination optical system for illuminating a pattern on a mask using arc-shaped illumination light, a projection optical system for projecting the pattern on the mask illuminated by the illumination optical system onto a plate, a mask stage for scanning the mask, a plate stage for scanning the plate, the scanning exposure apparatus scanning the mask stage and plate stage synchronously relative to the projection optical system, a mask support mechanism for supporting a periphery of the mask, and a plate stage tilt mechanism for arranging a surface of the plate in an object-surface-side focal plane of the projection optical system, which plane images the pattern in an area illuminated by the arc-shaped illumination light, wherein the mask deforms due to its own weight from the supported periphery.

A scanning exposure apparatus of still another aspect of the present invention includes an illumination optical system for illuminating a pattern on a mask using arc-shaped illumination light, a projection optical system for projecting the pattern on the mask illuminated by the illumination optical system onto a plate, a mask stage for scanning the mask, a plate stage for scanning the plate, the scanning exposure apparatus scanning the mask stage and plate stage synchronously relative to the projection optical system, a mask support mechanism for supporting a periphery of the mask, and a mechanism for tilting the mask stage and the plate stage for arranging a surface of the plate in an object-surface-side focal plane of the projection optical system, which plane images the pattern in an area illuminated by the arc-shaped illumination light, wherein the mask deforms due to its own weight from the supported periphery.

The mask support mechanism may support the mask at least at two sides parallel to and/or perpendicular to a scan direction. The mask support mechanism may support the mask only at two sides parallel to a scan direction. The mask stage tilt mechanism may tilt the mask relative to the scan direction by tilting a stage stool mounted with the mask. The scanning exposure apparatus may further include a projection magnification correction mechanism for correcting a projection magnification in a direction orthogonal to a scan direction. The scanning exposure apparatus may further include a stage control mechanism for synchronizing the mask stage and plate stage at a speed ratio corresponding to a projection magnification of the projection optical system, and for scanning relative to the projection optical system, wherein the stage control mechanism adjusts the speed ratio according to tilts of the mask and plate.

A scanning exposure method of another aspect of the present invention for illuminating a pattern on a mask using arc-shaped illumination light, and for projecting the pattern on the mask illuminated by the illumination optical system onto a plate, the scanning exposure apparatus scanning the mask and plate synchronously relative to a projection optical system includes the steps of exposing a focus-measurement pattern mask, measuring a focus position of a specific area from light intensity or resolution performance of a focus measurement pattern image on the plate, interpolating a measurement result linearly and identifying an image plane position, calculating a tilt angle for tilting the mask and/or plate to arrange a surface of the plate on a focal plane at an image-surface position, correcting a tilt of a mask stage and/or plate stage based on calculated data, and exposing an actual mask.

The scanning exposure method may further include, in measuring a focus state of the specific area from the focus measurement pattern, the steps of scanning only the focus-measurement pattern mask in a scan direction, and identifying the image-surface position based on an output from a light quantity detector arranged in a specific exposure area.

The scanning exposure method may further include, in measuring the focus state of the specific area from the focus measurement pattern, the steps of exposing the focus-measurement pattern mask and a plate that applies a photosensitive material, in a scan direction, verifying a focus state from a sensitized image on the plate, and identifying the image-plane position based on verified data.

A device fabrication method of another aspect of the present invention includes the steps of exposing a device pattern onto a plate using the above scanning exposure method, and developing the plate that has been exposed.

DETAILED DESCRIPTION OF THE PREFERRED EMBODIMENTS

Figure 1:
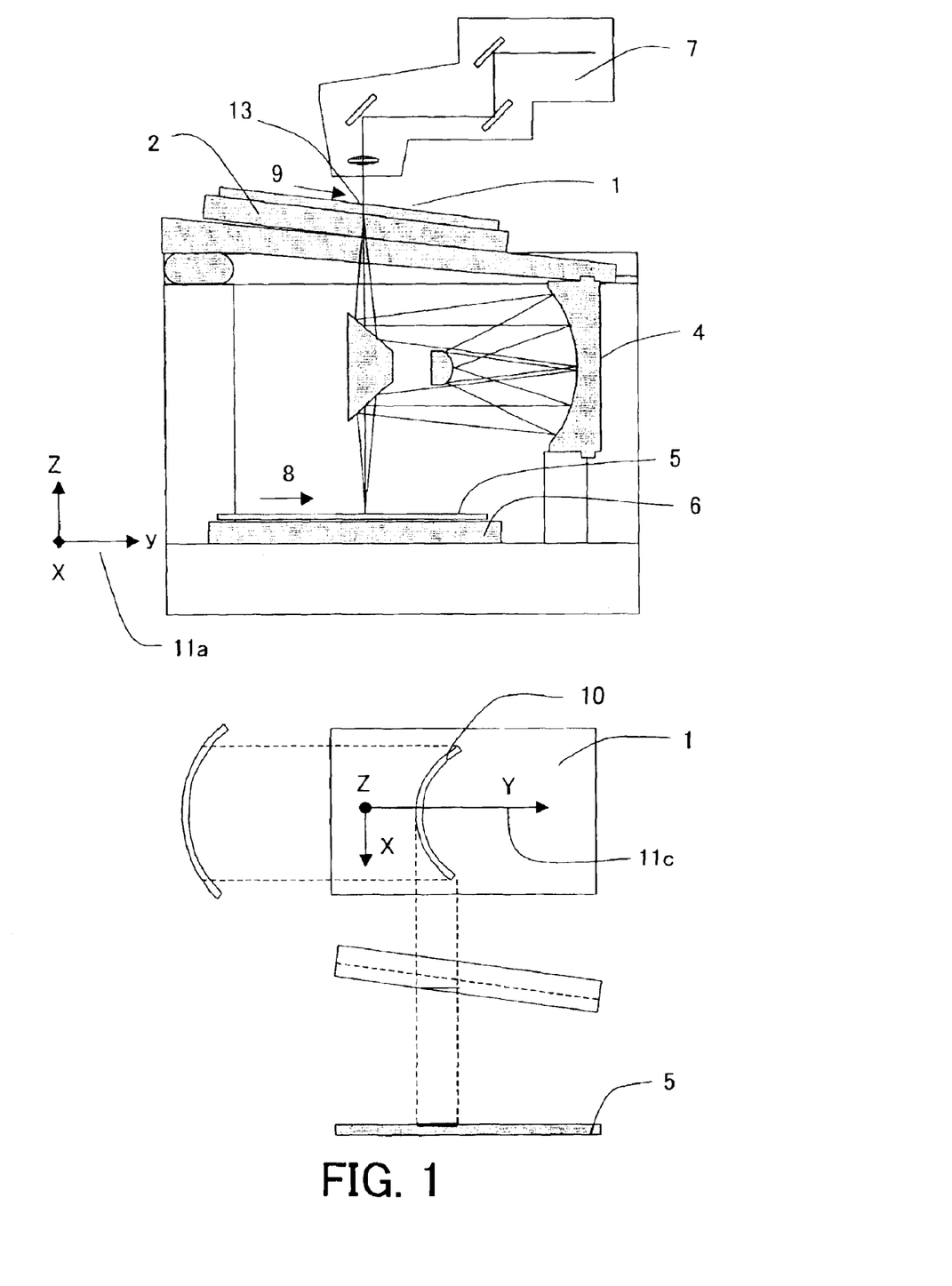
FIG. 1 is a schematic view of a principal part of a first embodiment according to the present invention.

FIG. 1 is a schematic view of a principal part of a first embodiment according to the present invention, wherein reference numeral 1 denotes a mask. A mask support method uses a mask support mechanism 15 shown in FIG. 7 to adsorb and support the mask along its two sides in a scan direction, and allows it to deform due to its own weight, as shown in FIG. 8 in a direction X or direction Y orthogonal to the scan direction or direction X. This method provides the mask with a constant sectional shape. A mask stage stool 3 (see FIG. 4) that supports a mask stage 2 inclines in a direction to correct an offset of an imaging position of the arc-shaped illuminated pattern 10 on the mask or a direction to correct an optical distance between the arc-shaped illuminated area of the mask 1 and the plate 5. The pattern on the mask 1 is exposed onto the plate 5 in this state. Reference numeral 4 is a projection optical system, and 6 is a plate stage for supporting the plate 5 made of a glass plate. UV reactive photoresist is applied onto the surface of the plate 5.

Alternatively, the present invention may incline the plate 5 rather than the mask 1 (as in a second embodiment) or both of them simultaneously (as in a third embodiment), as described later.

Reference numeral 13 is arc-shaped illumination light from an illumination system 7. As illustrated, the illumination system 7 provides the arc-shaped illumination light 13 using an arc slit-shaped aperture or a slit aperture that is arranged immediately before the mask 1 or at a position optically conjugate with the mask 1. Alternatively, use of an optical element such as a cylindrical lens would provide similar arc-shaped illumination light, and form an arc-shaped illumination area pattern 10 on the mask pattern surface.

As illustrated, reference numeral 11 denotes an XYZ coordinate system. The illuminated scanning exposure apparatus aligns a longitudinal direction of the arc-shaped illumination light 13 with the X-axis direction, a transverse direction or a scan direction for the mask stage 2 and plate stage 6 with a Y-axis direction, and a direction perpendicular to the XY plane with a Z-axis direction.

The instant embodiment projects and transfers only part 10 of the pattern on the mask 1, which is subjected to the arc-shaped illumination light. The entire circuit pattern on the mask 1 is projected and transferred onto the plate 5 by scanning the mask 1 at a specified speed in a direction of an arrow 9, as well as scanning the plate stage 6 in a direction of an arrow 8 at a speed of the former speed multiplied by an imaging magnification of the projection optical system 4.

A stage control system synchronizes the mask stage 2 and the plate stage 6, and controls their scans. After the entire circuit pattern is transferred, the plate stage 6 moves or steps by a specified amount in the directions X and Y to repeat a pattern transfer of many different locations on the plate 5 in the same way as described above.

In supporting the mask 1, the mask support means 15 cannot mechanically intercept a light path of the above projection optical system. As the mask 1 and plate 5 are scanned relative to the projection optical system, the mask 1 can be supported at only its periphery. Thus, the mask 1 deforms in a gravity direction due to its own weight. When this gravity deformation of the mask 1 is viewed from the projection optical system, a center part of the mask 1 approaches to the plate 5 in the optical-axis direction of the projection optical system, and the periphery separates from the plate in the optical-axis direction. As a result, a pattern or image shape on an image surface position through the projection optical system 4 defocuses the center part and focuses the periphery of the arc-shaped illuminated pattern.

Figure 7:
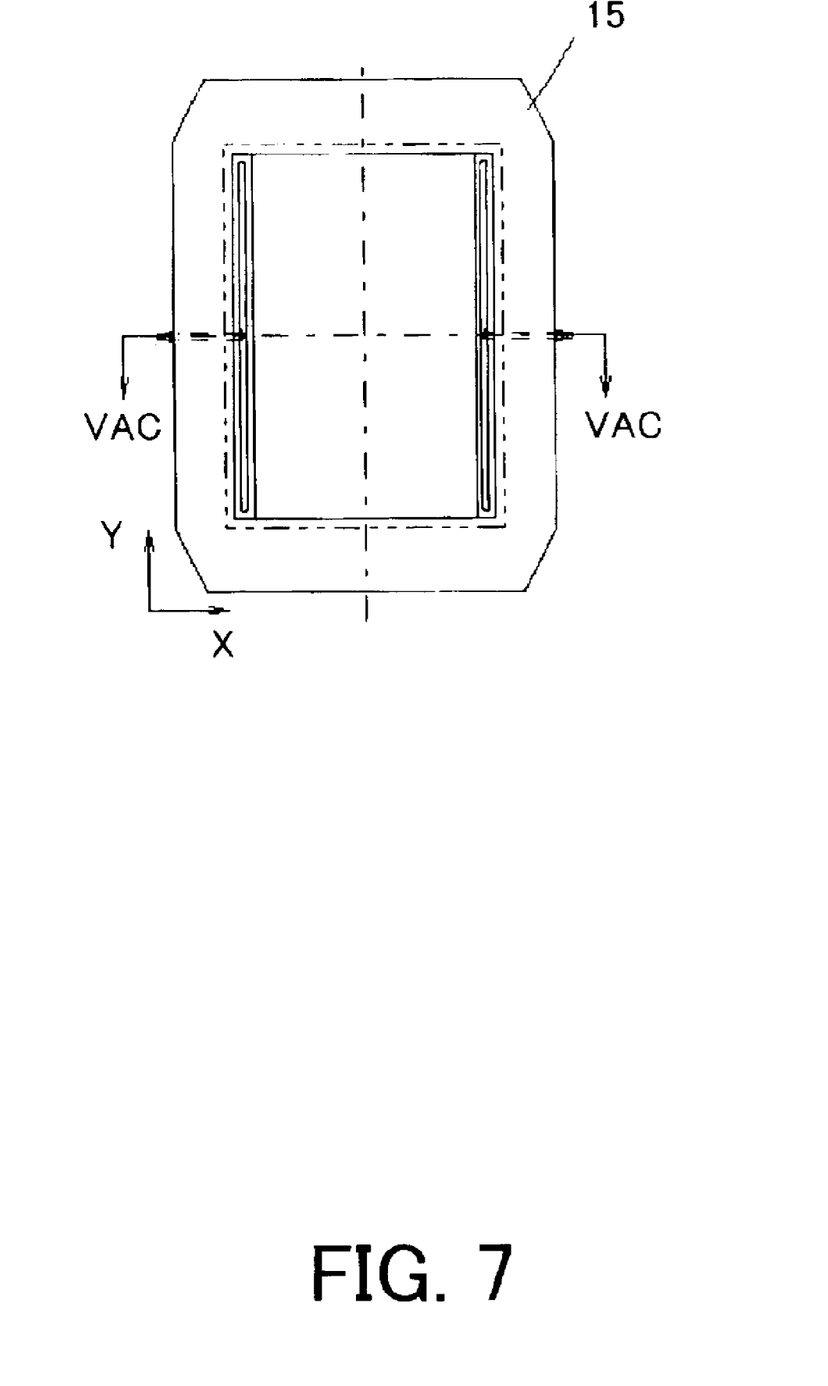
FIG. 7 is a schematic view of a mask support method that absorbs two sides in a scan direction.
Figure 8:
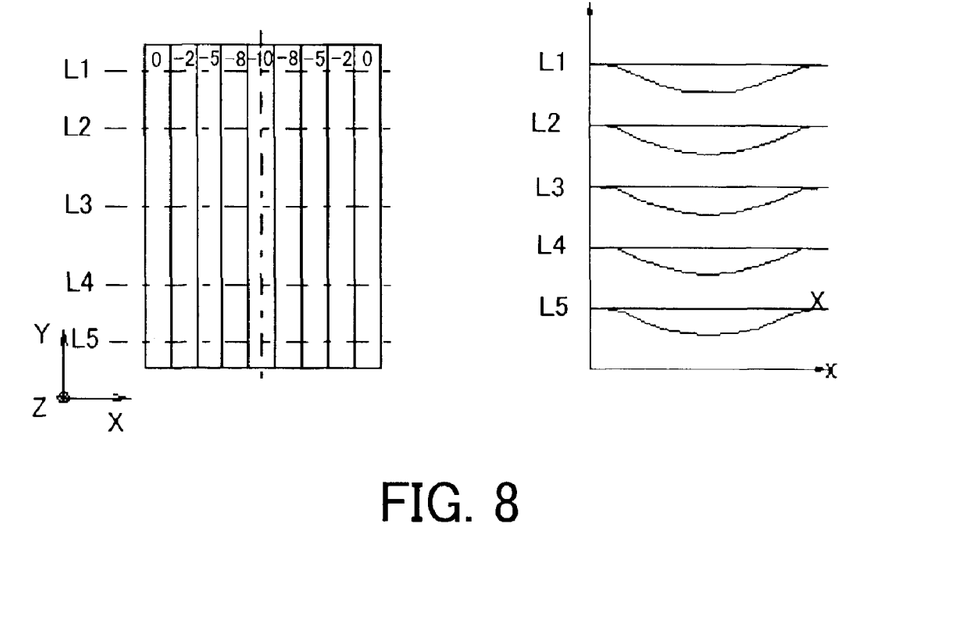
FIG. 8 is a view for explaining a gravity deformation in a mask support method that absorbs two sides.

The present embodiment cancels out a deformation of the mask 1 by making constant a distance between the illuminated area 10 on the mask 1 and the illuminated area 13 on the plate 5 as follows:

The mask support means 15 in FIG. 7 initially supports the mask 1 so that the mask 1 is deformable due to its own weight in a specific direction, whereby the mask 1 is stable dynamically. The mask 1 or mask stage stool 3 then inclines to make constant a distance between the illuminated area 10 on the mask 1 and the plate 5, whereby the part of the pattern irradiated by the arc-shaped illumination light corresponds approximately to the object surface of the projection optical system 4. Since the pattern image surface that is imaged via the optical system corresponds approximately to the surface of the plate 5, the arc-shaped pattern image focuses on the surface of the plate 5 for optimal exposure.

The gravity deformation of the mask 1 magnifies a projected image in a direction orthogonal to the scan direction. Tilt of the mask 1 or plate 5 from the scan direction to the optical-axis direction magnifies a pattern image in the scan direction.

A magnification correction optical system 4a disclosed in Japanese Patent Publication No. 8-306618 filed by the instant applicant is applicable to correct an imaging magnification in a direction orthogonal to the scan direction. The stage control system changes a speed ratio between the mask 1 and the plate 5 to correct a projection or scan magnification in the scan direction.

A fixed support of edges of the mask 1 does not make the mask pattern surface to be a perfectly cylindrical surface, and would cause distortion in a projected image. Nevertheless, this may be corrected by an optical correction means (not shown).

Thus, the present embodiment properly focuses the entire arc slit area, which has been difficult, and provides a pattern image corresponding to the performance of the projection optical system 4.

Figure 2:
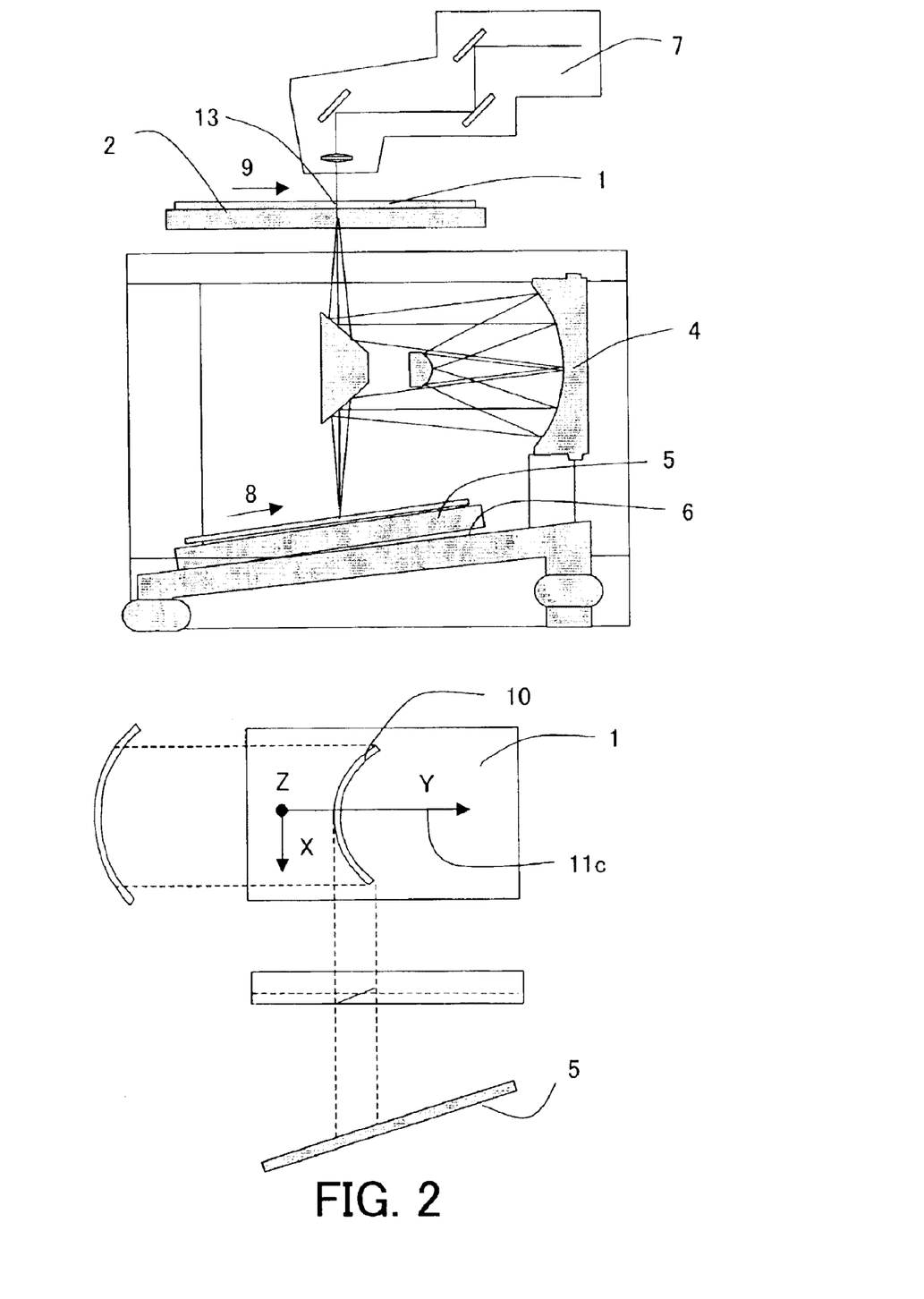
FIG. 2 is a schematic view of a principal part of a second embodiment of the present invention.

FIG. 2 is a schematic view of a principal part of the second embodiment according to the present invention. This embodiment differs from the first embodiment of FIG. 1 in inclining the plate 5, instead of the mask 1, in exposing a pattern on the mask 1 onto the plate 5. The remaining structure is almost the same.

Similarly, the mask 1 deforms due to its own weight when supported at its periphery. The mask in this embodiment deforms and the pattern image surface on the plate 5 forms the central part of the arc-shaped pattern image on a cylindrical side surface that bends towards the mask 1. Taking this fact into consideration, the second embodiment inclines the plate 5 correspondingly and scans it for exposure.

A means for tilting the plate 5 may use, for example, a tilt mechanism for a plate stage.

Thus, the embodiment properly focuses the entire arc slit area, which has been difficult, and provides a pattern image with high resolution.

Figure 3:
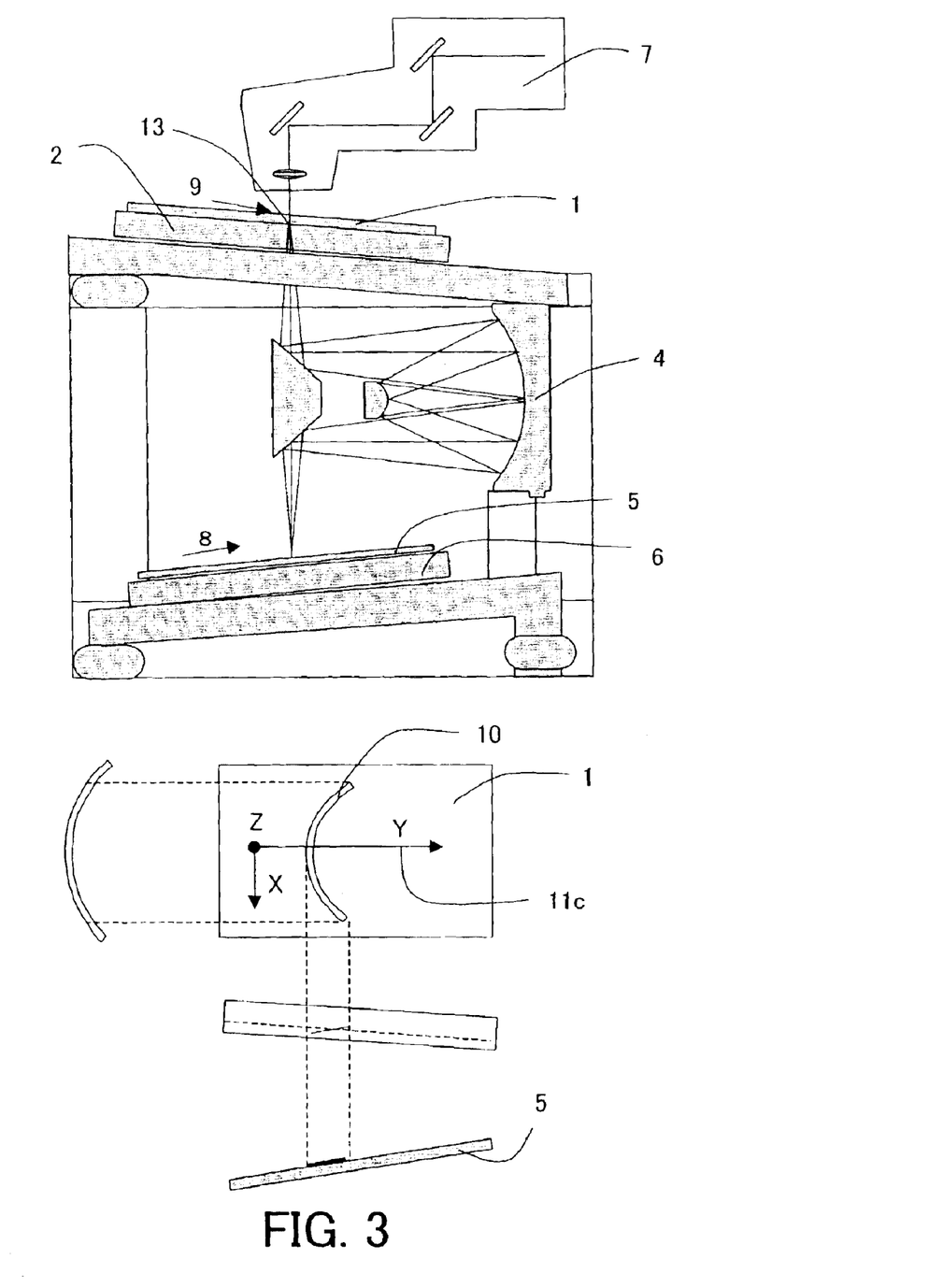
FIG. 3 is a schematic view of a principal part of a third embodiment of the present invention.

FIG. 3 is a schematic view of a principal part of the third embodiment according to the present invention. This embodiment differs from the first embodiment of FIG. 1 in inclining both the mask 1 and the plate 5 relative to the scan direction to expose a pattern on the mask 1 onto the plates. The other structure is almost the same.

Similarly, the mask 1 deforms due to its own weight when supported at its periphery. The mask 1 in this embodiment deforms and the pattern image surface on the plate 5 forms the central part of the arc-shaped pattern image on a cylindrical side surface that bends towards the mask 1. Handling this phenomenon in an exposure system, the third embodiment inclines the mask 1 and plate 5 correspondingly and scans them for exposure.

This embodiment uses the mask support means 15 shown in FIG. 7 to support the mask 1, and then inclines both the mask 1 and plate 5 at the same time relative to the scan direction while maintaining constant a distance between the arc-shaped illuminated area 10 of the mask 1 and the plate 5.

In other words, instead of inclining only the mask 1, as in the first embodiment, or only the plate 5, as in the second embodiment, this embodiment inclines both the mask 1 and the plate 5 at the same time.

The instant embodiment inclines both the mask 1 and the plate 5 at the same time with a smaller tilt amount to correct defocus than inclining either one separately.

Three embodiments have been discussed which simply incline the mask 1 and/or plate 5, and scan them in their longitudinal directions. The above embodiments are comparatively simple and effective ones.

Figure 4:
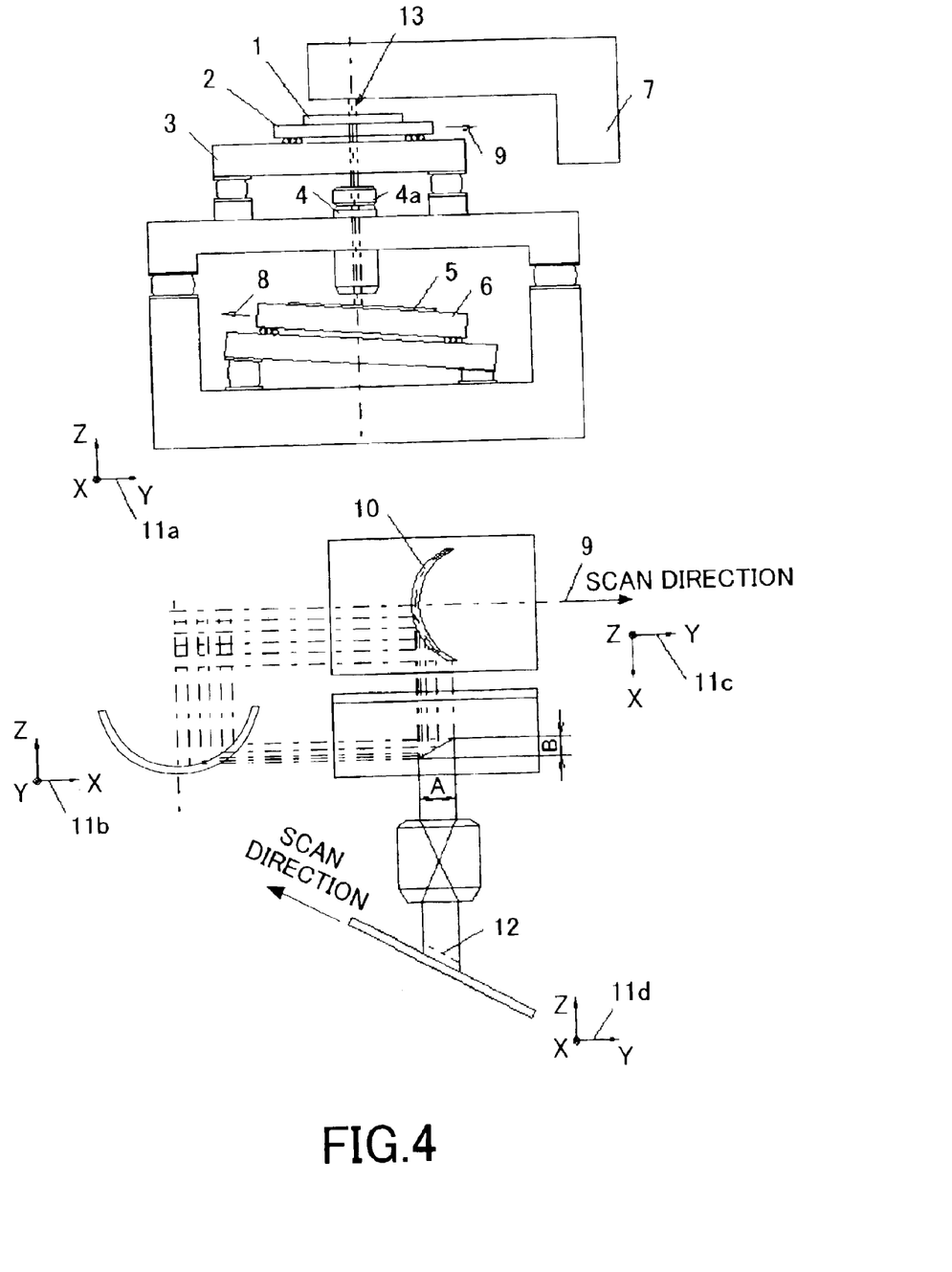
FIG. 4 is schematic view of a principal part of a fourth embodiment of the present invention.

Next, follows a description of the invention that successfully handles with the problematic mask 1 with deformation shown in FIGS. 4 and 5 based on these embodiments.

The above three embodiments are also effective to this case by supporting the mask 1 and/or the plate 5 so that they may be scanned in their longitudinal directions, adjusting their tilts at a proper time, and preferably adjusting their tilt angles according to their scan positions.

For example, the deformation on the mask 1 caused by its own weight as shown in FIGS. 4 and 5 is correctable when the tilt angle linearly changes according to the scan position of the mask 1.

A description will be given with reference to FIG. 9, which is a view for explaining a relationship between a scan position and a tilt angle of the stages that support the mask 1 and/or the plate 5 in the above three embodiments.

Figure 9:
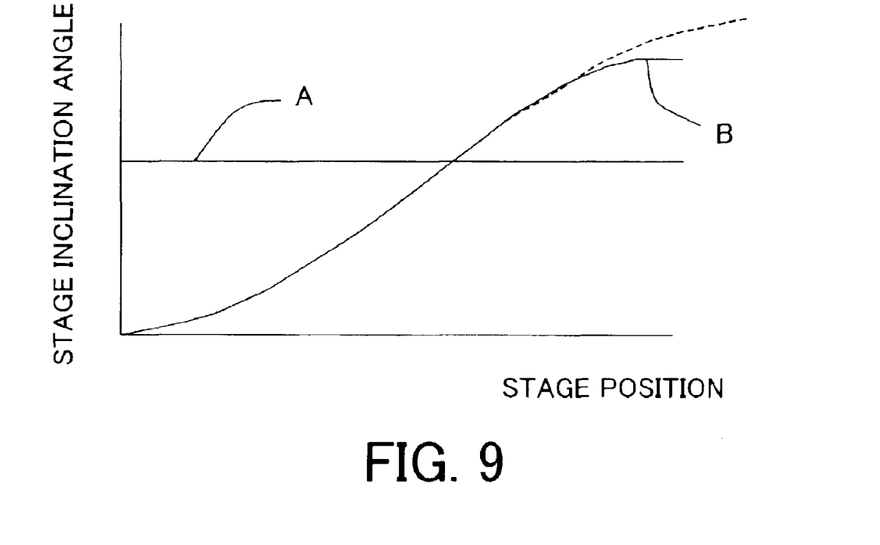
FIG. 9 is a view for explaining first to fourth embodiments and a stage correction amount.

The above three embodiments may scan at an almost constant tilt angle "A" in FIG. 9. In this case, the tilt angle of the stage may be mechanically adjusted or controlled. On the other hand, it is fairly complicated for the deforming mask 1 shown in FIGS. 4 and 5. Originally, the present invention is remarkably effective in an apparatus having a two-dimensional exposure area. It is an exemplary object of the present invention to align with the plate 5, positions of the foremost and backmost scan patterns in the optical-axis direction.

It is important for the deforming mask 1 shown in FIGS. 4 and 5 that the two-dimensional exposure area accords with a top surface of the plate 5 statistically. As shown by "B" in FIG. 9, this embodiment linearly changes a relationship between the stage position and the stage tilt angle. A part shown by a broken line in FIG. 9 indicates an axially symmetrical two-dimensional exposure area in the scan direction, while "B" in FIG. 9 is an asymmetrical one in the scan direction. Scanning for the asymmetrical area requires balancing the focusing state between the foremost and backmost patterns in a scan pattern.

Since the mask 1 has a constant thickness over processes, a representative mask usable for one exposure process may be used to prepare a tilt angle table. Alternatively, a tilt amount of the mask 1 and/or the plate 5 may be calculated based on a calculation result of the deformation amount of the mask 1, and used to control the tilt angle.

Figure 10:
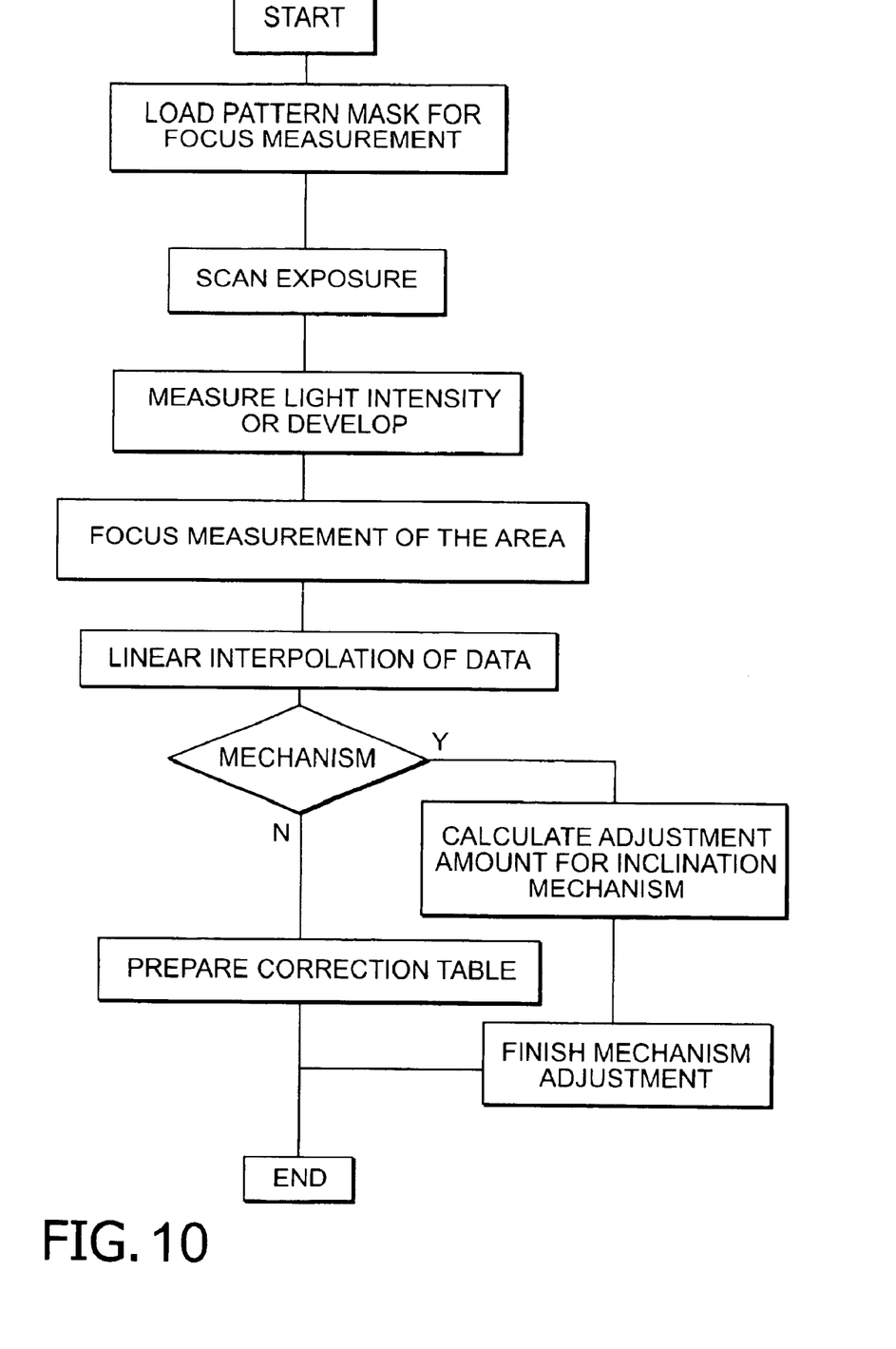
FIG. 10 is a flowchart for acquiring a tilt correction amount.

FIG. 10 is a flowchart to acquire a tilt correction amount by gathering the above necessary data for adjustment and correction. A pattern mask for focus measurement is initially prepared to obtain the correction amount, and mounted onto an exposure apparatus. A next exemplary step arranges, at least at three places in a two-dimensional slit pattern image area, a light quantity measurement apparatus that sets its measurement focus position at a virtual plate surface position, and performs scan exposure using a focus-measurement pattern mask. A fluctuation amount of an image-surface position due to the deforming mask may be analyzed using a relationship between an irradiation position on the pattern mask and the measured light quantity and linear interpolation process of data. The analytical result would provide a calculated adjustment amount for a tilt mechanism, and a correction table.

An alternative embodiment prepares a focus-measurement mask pattern, loads it into an exposure apparatus, and then scan-exposes a focus-evaluation plate onto which a photoresist has been applied. A focus state of the two-dimensional exposure areas may be measured through evaluation of the pattern that has been developed.

The method for identifying the focus position by actual exposure may use a plate with a photosensitive material that requires no development, such as a photochromic material, for quick and inexpensive evaluations, instead of a plate with a development-requiring photosensitive material such as a photoresist. The entire area on the plate may be measured for this purpose, but a specific area on the plate may be measured discretely for saving the measurement and processing time.

Focus data is linearly interpolated for specific representative points in the exposure area and determines a stage tilt angle according to stage positions. In adjusting a mechanism, the adjustment amount for the tilt means is calculated based on the data.

The mechanism is thus adjusted. In controlling a stage tilt according to stage positions, a correction table, for example, may be prepared and used for control over the stage position.

A usual exposure step follows.

A description will now be given of an embodiment of a liquid crystal panel fabrication method using the above projection exposure apparatus.

Figure 11:
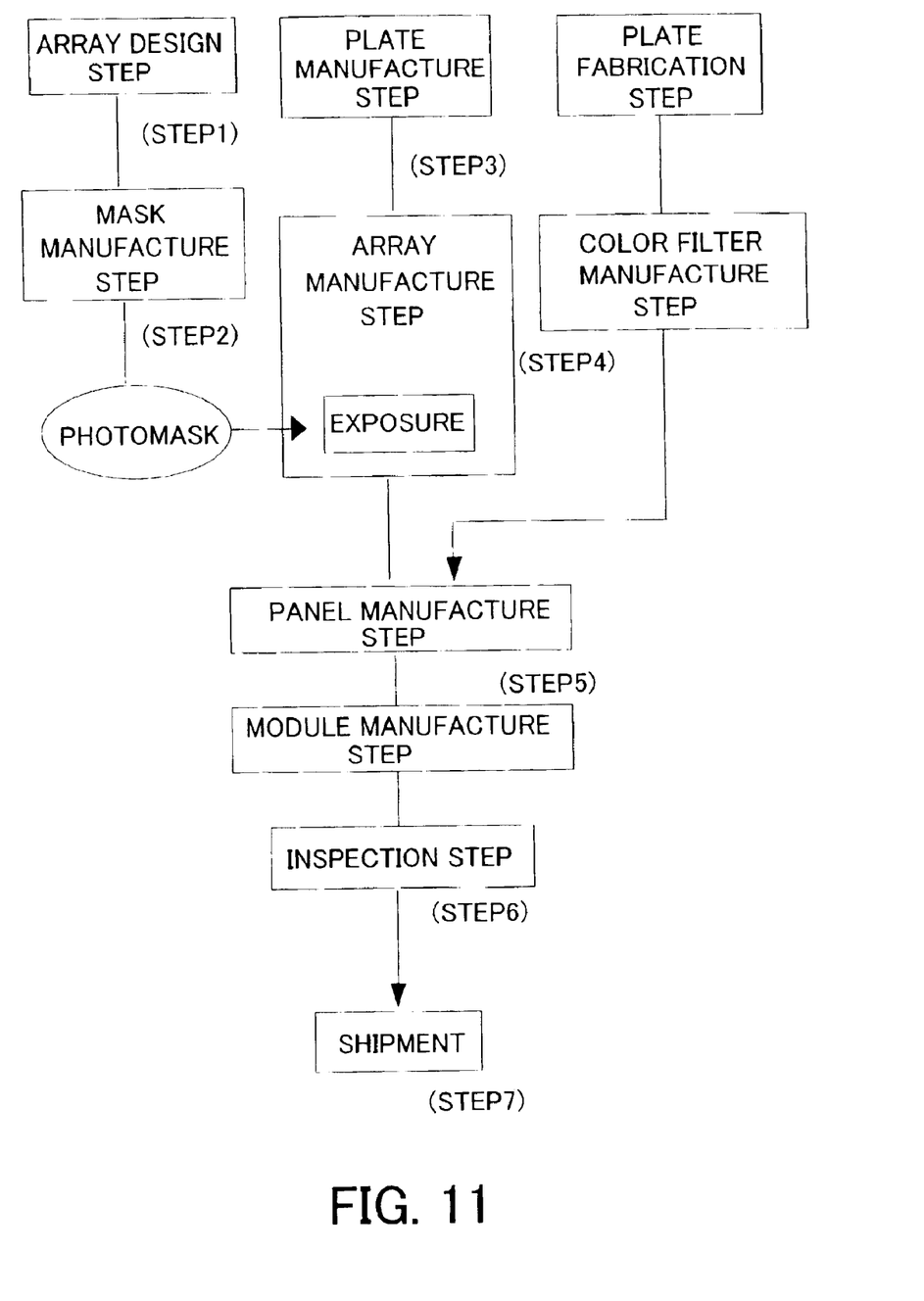
FIG. 11 is a flowchart for explaining a device fabrication method according to the present invention.

FIG. 11 is a flowchart for manufacturing a liquid crystal panel. In this embodiment, Step 1 (array design step) designs a liquid crystal array circuit. Step 2 (mask manufacture step) forms a mask having the designed array pattern. Step 3 (plate manufacture step) manufactures a glass plate. Step 4 (array manufacture step), which is also referred to as "pretreatment", forms actual circuitry on the glass plate through photolithography using the mask and plate that have been prepared.

Step 5 (panel manufacture step), which is also referred to as "post-treatment", seals a back periphery that has been pasted together with a color filter that has been manufactured by a separate step, and implants a liquid crystal. Step 6 (inspection step) performs various tests, such as a performance test and a durability test, for a liquid crystal panel module that has assembled tabs and backlight, and is aged after Step 5. A liquid crystal panel is finished and shipped through these steps (Step 7).

Figure 12:
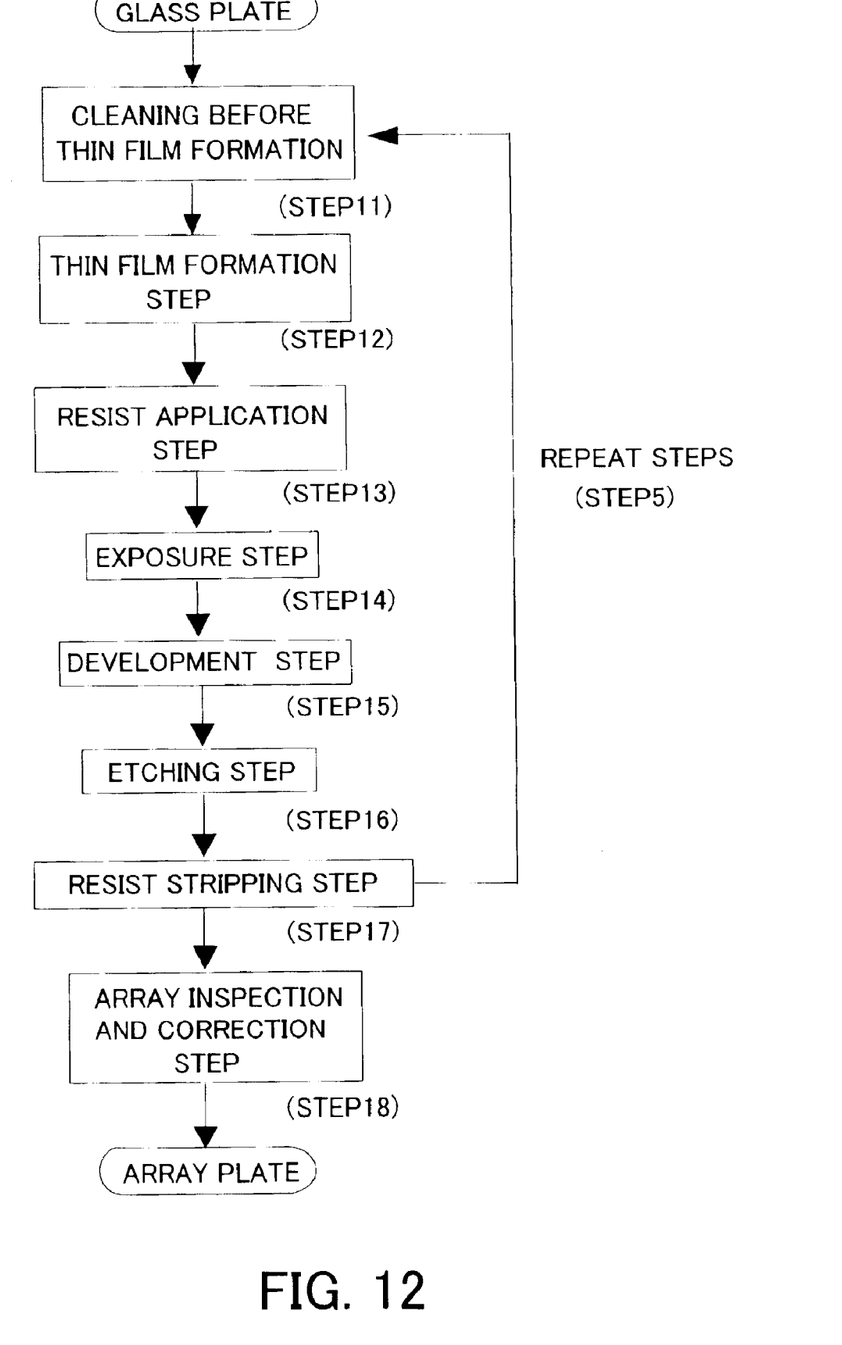
FIG. 12 is a flowchart for explaining a device fabrication according to the present invention.

FIG. 12 is a detailed flowchart for the array manufacture in Step 4. Step 11 (cleaning before thin-film formation) cleanses the glass plate as a pretreatment prior to forming a thin film on its surface. Step 12 (PCVD) forms a thin film on the surface of the glass plate. Step 13 (resist application step) applies a desired resist to the surface of the glass plate, and bakes it. Step 14 (exposure step) exposes the array pattern on the mask onto the glass plate using the above exposure apparatus.

Step 15 (development step) develops the exposed glass plate. Step 16 (etching step) etches out parts other than the developed resist images. Step 17 (resist stripping step) removes unused resist after etching. These steps repeat until multi-layer circuit patterns are formed onto the plate.

Use of the manufacture method of this embodiment would easily manufacture a high-quality liquid crystal panel.

The above-described embodiments facilitate understanding of the present invention, but do not intend to limit its scope. Each element disclosed in the above embodiments intends to cover all the modifications and equivalents within the scope of the present invention.

For example, while the above embodiments discuss a life-size scanning exposure apparatus of a mirror projection manner, the present invention is applicable to an exposure apparatus that illuminates a mask using arc-shaped illumination light, such as a step-and-scan reduction projection exposure apparatus that has a catadioptric system as a projection optical system.

FIG. 4 is a schematic view of a principal part of a fourth embodiment of this invention. This embodiment differs from the first to third embodiments in that its projection optical system is a catadioptric system. The other structure is the same as described above.

This embodiment may incline the mask 1, the plate 5, or both the mask 1 and the plate 5.

The magnification correction in the scan direction and the magnification correction in a direction orthogonal to the scan direction are the same as described for the first embodiment.

The instant embodiment forms an image inversed by 180 degrees to the mirror projection type, uses the inverted scan directions for the mask 1 and plate 5, as shown in FIG. 4 compared to FIG. 2, and thus, the inverted tilt directions. The other structure is the same as the above.

The illumination light for exposure may use any one of emission lines emitted from a mercury lamp (e.g., g-line, and i-line), a KrF excimer laser (with a wavelength of 248 nm), an ArF excimer laser (with a wavelength of 193 nm), an $F_2$ laser (with a wavelength of 157 nm), an $Ar_2$ laser (with a wavelength of 126 nm), a YAG laser, and other higher harmonic waves.

The present invention is applicable not only to an exposure apparatus for fabricating an LCD device, but to one for fabricating a semiconductor device, a thin film magnetic head, and an image pick-up device (e.g., CCDs, and the like), as well as one that transfers a circuit pattern to a glass plate, a silicon wafer, or the like, in order to make a reticle or a mask.

Thus, the present invention may provide a scanning exposure apparatus, as well as a device fabrication method using the same, which facilitates projection exposure onto a large screen with high resolution in illuminating a mask that deforms due to its own weight, using arc-shaped illumination light to expose a pattern on the mask onto a plate through the projection optical system using a scanning exposure method, and a mask support method for arranging in place an arc-shaped illuminated mask pattern image surface and a plate surface imaged by the projection optical system. When arc-shaped illumination light is used to illuminate a mask, and a pattern on the mask is projected and exposed onto a plate by a projection optical system using a scanning exposure method, this invention can provide a scanning exposure apparatus, as well as a device fabrication method using the same, that can easily project and expose onto a large screen with high resolution, however, the mask may be deformed, by deforming the mask into an appropriate shape, and correcting the distance between the plate and the arc-shaped illuminated area of the mask.

In addition, the present invention enables a scanning exposure apparatus with arc-shaped illumination light to adjust the focus across the entire arc-shaped illumination area by tilting only the plate or both the mask and the plate concurrently.

The present invention may effectively correct defocus due to gravity deformation of the mask.

What is claimed is:

1. A scanning exposure apparatus comprising:
    an illumination optical system for illuminating a pattern on a mask using arc-shaped illumination light;
    a projection optical system for projecting the pattern on the mask illuminated by said illumination optical system onto a plate;
    a mask stage for scanning the mask;
    a plate stage for scanning the plate, said scanning exposure apparatus scanning said mask stage and plate stage synchronously relative to said projection optical system;
    a mask support mechanism for supporting a periphery of the mask; and
    a mask stage tilt mechanism for arranging the pattern in an area illuminated by the arc-shaped illumination light in an object-surface-side focal plane of said projection optical system, wherein the mask deforms due to its own weight from the peripheral support,
    wherein said mask support mechanism supports the mask only at two sides parallel to a scan direction.

2. A scanning exposure apparatus according to claim 1, wherein said stage tilt mechanism tilts the mask relative to the scan direction by tilting a stage stool mounted with the mask.

3. A scanning exposure apparatus according to claim 1, further comprising a projection magnification correction mechanism for correcting a projection magnification in a direction orthogonal to a scan direction.

4. A scanning exposure apparatus according to claim 1, further comprising a stage control mechanism for synchronizing said mask stage and plate stage at a speed ratio corresponding to a projection magnification of said projection optical system, and for scanning relative to said projection optical system, wherein said stage control mechanism adjusts the speed ratio according to tilts of the mask and plate.

5. A scanning exposure apparatus comprising:
    an illumination optical system for illuminating a pattern on a mask using arc-shaped illumination light;
    a projection optical system for projecting the pattern on the mask illuminated by said illumination optical system onto a plate;
    a mask stage for scanning the mask;
    a plate stage for scanning the plate, said scanning exposure apparatus scanning said mask stage and plate stage synchronously relative to said projection optical system;
    a mask support mechanism for supporting a periphery of the mask; and
    a plate stage tilt mechanism for arranging a surface of the plate in an object-surface-side focal plane of said projection optical system, which plane images the pattern in an area illuminated by the arc-shaped illumination light, wherein the mask deforms due to its own weight from the peripheral support,
    wherein said mask support mechanism supports the mask only at two sides parallel to a scan direction.

6. A scanning exposure apparatus according to claim 5, wherein said mask stage tilt mechanism tilts the mask relative to the scan direction by tilting a stage stool mounted with the mask.

7. A scanning exposure apparatus according to claim 5, further comprising a projection magnification correction mechanism for correcting a projection magnification in a direction orthogonal to a scan direction.

8. A scanning exposure apparatus according to claim 5, further comprising a stage control mechanism for synchronizing said mask stage and plate stage at a speed ratio corresponding to a projection magnification of said projection optical system, and for scanning relative to said projection optical system, wherein said stage control mechanism adjusts the speed ratio according to tilts of the mask and plate.

9. A scanning exposure apparatus comprising:

an illumination optical system for illuminating a pattern on a mask using arc-shaped illumination light;

a projection optical system for projecting the pattern on the mask illuminated by said illumination optical system onto a plate;

a mask stage for scanning the mask;

a plate stage for scanning the plate, said scanning exposure apparatus scanning said mask stage and plate stage synchronously relative to said projection optical system;

a mask support mechanism for supporting a periphery of the mask; and a mechanism for tilting the mask stage and the plate stage for arranging a surface of the plate in an object-surface-side focal plane of said projection optical system, which plane images the pattern in an area illuminated by the arc-shaped illumination light, wherein the mask deforms due to its own weight from the peripheral support, wherein said mask support mechanism supports the mask only at two sides parallel to a scan direction.

10. A scanning exposure apparatus according to claim 9, wherein said mask stage tilt mechanism tilts the mask relative to the scan direction by tilting a stage stool mounted with the mask.

11. A scanning exposure apparatus according to claim 9, further comprising a projection magnification correction mechanism for correcting a projection magnification in a direction orthogonal to a scan direction.

12. A scanning exposure apparatus according to claim 9, further comprising a stage control mechanism for synchronizing said mask stage and plate stage at a speed ratio corresponding to a projection magnification of said projection optical system, and for scanning relative to said projection optical system, wherein said stage control mechanism adjusts the speed ratio according to tilts of the mask and plate.

* * * * *

UNITED STATES PATENT AND TRADEMARK OFFICE
CERTIFICATE OF CORRECTION

PATENT NO. : 6,947,122 B2 Page 1 of 1
APPLICATION NO. : 10/601553
DATED : September 20, 2005
INVENTOR(S) : Tohru Kohda et al.

It is certified that error appears in the above-identified patent and that said Letters Patent is hereby corrected as shown below:

ON THE COVER PAGE:
In item "(57) ABSTRACT," in the last line, "ported." should read -- port. --.

COLUMN 5:
Line 40, "to" should be deleted.

COLUMN 6;
Line 8, "docs" should read -- does --.
Line 9, "to be" should be deleted.

COLUMN 7:
Line 2, the first occurrence of "with" should be deleted.

Signed and Sealed this

First Day of May, 2007

JON W. DUDAS
*Director of the United States Patent and Trademark Office*